US010343900B2

(12) United States Patent
Imhoff et al.

(10) Patent No.: US 10,343,900 B2
(45) Date of Patent: Jul. 9, 2019

(54) MATERIAL STRUCTURE AND METHOD FOR DEEP SILICON CARBIDE ETCHING

(71) Applicant: The Government of the United States of America, as Represented by the Secretary of the Navy, Washington, DC (US)

(72) Inventors: Eugene A. Imhoff, Washington, DC (US); Francis J. Kub, Arnold, MD (US); Karl D. Hobart, Alexandria, VA (US); Rachael L. Myers-Ward, Springfield, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/698,597

(22) Filed: Sep. 7, 2017

(65) Prior Publication Data
US 2018/0065844 A1    Mar. 8, 2018

Related U.S. Application Data

(60) Provisional application No. 62/384,463, filed on Sep. 7, 2016.

(51) Int. Cl.
*B81C 1/00*    (2006.01)

(52) U.S. Cl.
CPC .. *B81C 1/00619* (2013.01); *B81B 2201/0235* (2013.01); *B81B 2201/0242* (2013.01);
(Continued)

(58) Field of Classification Search
CPC ................................................ B81C 1/00619
(Continued)

(56) References Cited

U.S. PATENT DOCUMENTS

| 5,915,194 A | 6/1999 | Powell et al. |
| 6,670,278 B2 | 12/2003 | Li et al. |
| 2017/0140936 A1* | 5/2017 | Chu ..................... H01L 21/0475 |

OTHER PUBLICATIONS

E. Moyen et al., "Novel anodic aluminum oxide-based nanofabrication applications in physics and biology," Surface and Interface Analysis, vol. 42, pp. 1556-1560 (Jun. 8, 2010).
(Continued)

*Primary Examiner* — Roberts P Culbert
(74) *Attorney, Agent, or Firm* — US Naval Research Laboratory; Joslyn Barritt (57) ABSTRACT

Material structures and methods for etching hexagonal, single-crystal silicon carbide (SiC) materials are provided, which include selection of on-axis or near on-axis hexagonal single-crystal SiC material as the material to be etched. The methods include etching of SiC bulk substrate material, etching of SiC material layers bonded to a silicon oxide layer, etching of suspended SiC material layers, and etching of a SiC material layer anodically bonded to a glass layer. Plasma-etched hexagonal single-crystal SiC materials of the invention may be used to form structures that include, but are not limited to, microelectromechanical beams, microelectromechanical membranes, microelectromechanical cantilevers, microelectromechanical bridges, and microelectromechanical field effect transistor devices. The material structures and methods of the invention beneficially provide improved etch symmetry, improved etch straightness, improved sidewall straightness, improved sidewall smoothness, and reduced sidewall wander compared to etched four degree off-axis SiC materials.

17 Claims, 8 Drawing Sheets

(52) U.S. Cl.
CPC ......... *B81B 2201/0271* (2013.01); *B81B 2203/0109* (2013.01); *B81B 2203/0118* (2013.01); *B81B 2203/0127* (2013.01); *B81C 2201/0112* (2013.01)

(58) Field of Classification Search
USPC .......................................... 438/695
See application file for complete search history.

(56) References Cited

OTHER PUBLICATIONS

Laura J. Evans et al., "Deep Reactive Ion Etching (DRIE) of High Aspect Ratio SiC Microstructures using a Time-Multiplexed Etch-Passivate Process," Materials Science Forum, vols. 527-529, pp. 1115-1118 (Oct. 15, 2006).
Christopher L. Frewin et al., "A Comprehensive Study of Hydrogen Etching on the Major SiC Polytypes and Crystal Orientations," Materials Science Forum, vols. 615-617, pp. 589-592 (Mar. 2, 2009).
International Search Report and Written Opinion in counterpart Int'l Appl. No. PCT/US2017/050563.

\* cited by examiner

MATERIAL STRUCTURE AND METHOD FOR DEEP SILICON CARBIDE ETCHING

CROSS-REFERENCE TO RELATED APPLICATIONS

This application claims priority to U.S. Provisional Application No. 62/384,463, filed on Sep. 7, 2016, the contents of which are incorporated herein by reference in their entirety.

TECHNICAL FIELD

This application relates generally to etching of hexagonal, single-crystal silicon carbide (SiC) materials. The invention includes selection of on-axis or near on-axis hexagonal single-crystal SiC material as the material to be etched. The methods include etching of SiC bulk substrate material, etching of SiC material layers bonded to a silicon oxide layer, etching of suspended SiC material layers (i.e., the SiC layer is separated from a substrate layer by a gap), and etching of a SiC material layer anodically bonded to a glass layer. Plasma-etched hexagonal single-crystal SiC materials of the invention may be used to form structures that include, but are not limited to, microelectromechanical beams, microelectromechanical membranes, microelectromechanical cantilevers, microelectromechanical bridges, and microelectromechanical field effect transistor devices. The material structures and methods of the invention beneficially provide improved etch symmetry, improved etch straightness, improved sidewall straightness, improved sidewall smoothness, and reduced sidewall wander compared to etched off-axis SiC materials.

BACKGROUND OF THE INVENTION

Existing methods for etching SiC focus on etching of off-axis (particularly 4° off axis) SiC materials, and suffer from poor etch symmetry, poor etch straightness, poor sidewall straightness, poor sidewall smoothness, and high levels sidewall wander.

The SiC material structures and SiC etching methods of the invention in which SiC materials having on-axis or near on-axis orientation with respect to the c-axis are etched beneficially provide improved etch symmetry, improved etch straightness, improved sidewall straightness, improved sidewall smoothness, and reduced sidewall wander, particularly when compared to etched off-axis SiC materials.

SUMMARY OF THE INVENTION

The invention described herein, including the various aspects and/or embodiments thereof, meets the unmet needs of the art, as well as others, by providing material structures and methods for etching silicon carbide materials, particularly hexagonal, single-crystal silicon carbide (SiC) materials. The methods include selection of on-axis or near on-axis hexagonal single-crystal SiC material as the material to be etched. The material structures and methods of the invention beneficially provide improved etch symmetry, improved etch straightness, improved sidewall straightness, improved sidewall smoothness, and reduced sidewall wander compared to etched off-axis SiC materials.

In one aspect of the invention, a method for etching SiC is provided in which method for deep reactive-ion etching silicon carbide, including providing a hexagonal, single-crystal silicon carbide (SiC) material that is oriented approximately on-axis with respect to a c-axis of the SiC crystal; applying an etch mask to the SiC material; and conducting deep reactive-ion etching (RIE) of the SiC material. The etched SiC material comprises etch features having an aspect ratio (trench depth:trench width) greater than 25.

The methods include etching of SiC bulk substrate material, etching of SiC material layers bonded to a silicon oxide layer, etching of suspended SiC material layers, and etching of a SiC material layer anodically bonded to a glass layer.

According to another aspect of the invention, an etched, hexagonal, single-crystal silicon carbide (SiC) material is provided that is oriented approximately on-axis with respect to a c-axis of the SiC crystal material, including etch features having an aspect ratio (trench depth:trench width) greater than 25.

According to a further aspect of the invention, an etched, hexagonal, single-crystal silicon carbide (SiC) material is formed by a method including providing a hexagonal, single-crystal, silicon carbide (SiC) material that is oriented approximately on-axis with respect to a c-axis of the SiC crystal; applying an etch mask to the SiC material; and conducting deep reactive-ion etching (RIE) of the SiC material, wherein the etched SiC material comprises etch features having an aspect ratio (trench depth:trench width) greater than 25.

The materials may beneficially be used to form structures that include, but are not limited to, microelectromechanical beams, microelectromechanical membranes, microelectromechanical cantilevers, microelectromechanical bridges, and microelectromechanical field effect transistor devices.

Other features and advantages of the present invention will become apparent to those skilled in the art upon examination of the following or upon learning by practice of the invention.

BRIEF DESCRIPTION OF THE DRAWINGS

FIG. 5A was etched cool and grounded, FIG. 5B was etched warm and grounded, and FIG. 5C was etched warm and ungrounded.

DETAILED DESCRIPTION OF EMBODIMENTS OF THE INVENTION

The invention described herein, including the various aspects and/or embodiments thereof, meets the unmet needs of the art, as well as others, by providing methods for the deep etching of SiC, and SiC material structures created by the methods.

In some aspects, the invention includes selection of hexagonal single-crystal SiC material as the material to be etched on-axis or near on-axis. The methods include etching of SiC bulk substrate material, etching of SiC material layers bonded to a silicon oxide layer, etching of suspended SiC material layers (i.e., the SiC layer is separated from a substrate layer by a gap), and etching of a SiC material layer anodically bonded to a glass layer. Plasma-etched hexagonal single-crystal SiC materials of the invention may be used to form structures that include, but are not limited to, microelectromechanical beams, microelectromechanical membranes, microelectromechanical cantilevers, microelectromechanical bridges, and microelectromechanical field effect transistor devices. The material structures and methods of the invention beneficially provide improved etch symmetry, improved etch straightness, improved sidewall straightness, improved sidewall smoothness, and reduced sidewall wander compared to etched 4° off-axis SiC materials.

Definitions

Figure 1:
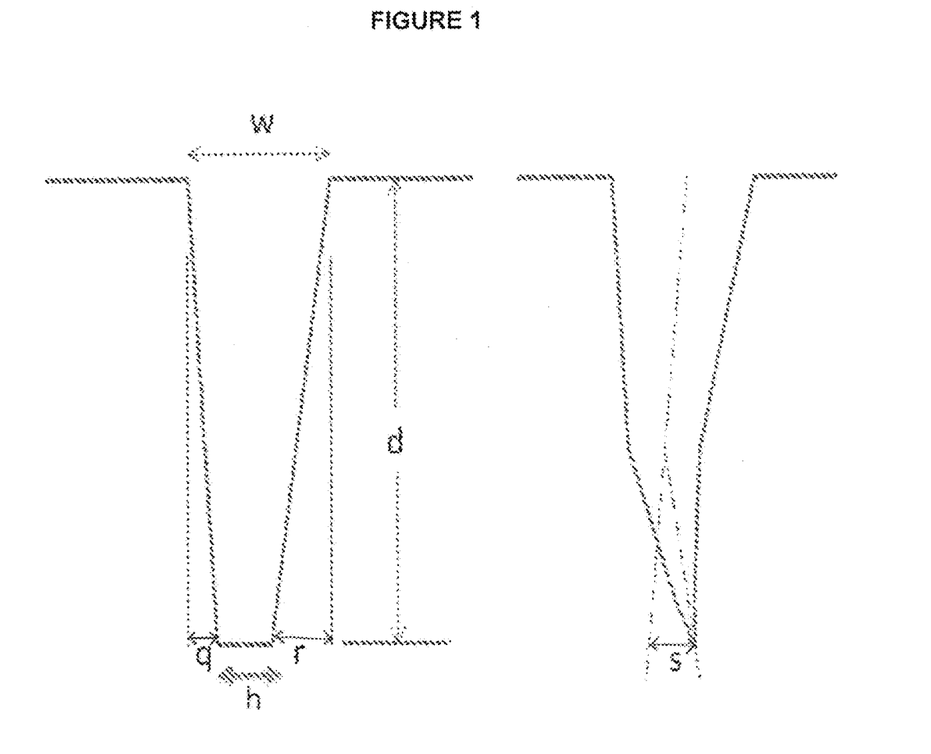
FIG. 1 is a diagram depicting various measurements used to evaluate aspects of an etched material structure or etching method in accordance with the invention.

The following definitions for etch parameters are provided with reference to FIG. 1:

Etch width at top is shown by w.

Etch width at bottom is shown by h.

Etch depth is shown by d.

Etch symmetry relates to the ratio of q/r or r/q. Ideal etch symmetry is achieved when q=r. However, it is to be understood that ideal etch symmetry is not required in accordance with the invention. In some aspects of the invention, the etch symmetry is within 15% of ideal, preferably within 10% of ideal, more preferably within 5% of ideal, still more preferably within 2.5% of ideal, and most preferably within 1% of ideal. In other aspects of the invention, the etch symmetry q/r is less than 1.1, or r/q is less than 1.1.

Etch straightness relates to the magnitude of q or r at selected etch depths. Ideal etch straightness is achieved when q=0 and/or r=0. However, it is to be understood that ideal etch straightness is not required in accordance with the invention. In some aspects of the invention, the etch straightness is within 25% of ideal, preferably within 20% of ideal, more preferably within 15% of ideal, still more preferably within 10% of ideal, and most preferably within 5% of ideal.

Etch axis wander is determined from the absolute value of s (i.e., [s]>0). Ideal axis wander is achieved when s=0. However, it is to be understood that ideal etch axis wander is not required in accordance with the invention. In some aspects of the invention, the etch axis wander is within 25% of ideal, preferably within 20% of ideal, more preferably within 15% of ideal, still more preferably within 10% of ideal, and most preferably within 5% of ideal.

Etch aspect ratio relates to the ratio of d/q or d/r, and in some aspects, the aspect ratio relates to the ratio d/h. The aspect ratio may range from 5:1 to 100:1 or greater. An aspect ratio greater than 25:1 is preferred in some embodiments. In other embodiments, a preferred aspect ratio is d/q>40, d/r>40, or d/h>40.

Etch sidewall smoothness relates to not having any depressions, pits, or spikes that extend, for example, more than 300 nm from an extended line of plasma etch sidewall profile that extends over a distance of greater 3 microns along the sidewall.

SiC Materials

Silicon carbide crystalline materials that may be used in accordance with the methods and material structures of the invention are preferably hexagonal crystalline forms, including, but not limited to, the 2H—SiC, 4H—SiC, and 6H—SiC hexagonal structures. Single-crystal or monocrystalline silicon carbide materials are also preferred in accordance with some aspects of the invention, and exhibit a continuous crystal lattice with minimal or no defects or grain boundaries.

It has been discovered that in order to permit deep etching in SiC with improved etch symmetry, improved sidewall straightness, reduced sidewall wander, and improved sidewall smoothness, on-axis or near on-axis silicon carbide material is preferred. The selection of on-axis or near on-axis silicon carbide has experimentally been shown to provide improved etch symmetry, improved sidewall straightness, reduced sidewall wander, and improved sidewall smoothness compared to off-axis SiC material, particularly 4° off-axis SiC material.

Etching on-axis hexagonal silicon carbide material is preferred in some aspects of the invention, as are material structures formed by etching on-axis hexagonal silicon carbide material. Etching of on-axis hexagonal silicon carbide material is particularly preferred in the production of silicon carbide gyroscopes, due to its near ideal isoelasticity, which is a key parameter for silicon carbide gyroscopes. The invention demonstrates that on-axis 4H—SiC in particular provides significantly better etching results than the typical off-axis hexagonal SiC material, particularly 4° off-axis 4H—SiC materials.

In some embodiments, the selection of on-axis, hexagonal, single-crystal SiC is important to achieve a deep SiC etch that exhibits improved etch symmetry, improved sidewall straightness, reduced sidewall wander, and improved sidewall smoothness compared to off-axis, hexagonal, single-crystal SiC materials.

As used herein, the term "on-axis" means that the silicon carbide material is etched on-axis with respect to the c axis [(0001) or (000-1)(overbar)] of the crystal structure of the hexagonal silicon carbide material, i.e., at 0° with respect to the c axis [(0001) or (000-1)(overbar)]. The terms "near on-axis," and "approximately on-axis," mean that the silicon carbide material is etched within 2.4° with respect to the c axis [(0001) or (000-1)(overbar)] of the hexagonal silicon carbide material.

In some embodiments, the hexagonal single-crystal SiC material can be doped, preferably so that the SiC material is n-type.

In some embodiments, the hexagonal single-crystal SiC material can be semi-insulating.

Methods

The methods of the invention are directed to on-axis and near on-axis deep etching of silicon carbide materials.

Preferably, the SiC materials are single crystal, hexagonal SiC materials, and may be doped or undoped. N-type 6H—SiC or 4H—SiC single-crystal material may be selected for etching in accordance with some aspects of the invention. The hexagonal SiC material may be a bulk substrate, an SiC material layer wafer bonded onto a dielectric layer in a semiconductor-on-insulator type of structure, an SiC material layer wafer bonded to a glass substrate, or a suspended material structure with a gap between the SiC layer and the substrate.

In some embodiments, reactive plasma etching is performed on hexagonal, single-crystal SiC material that is oriented approximately on-axis orientation with respect to the (0001) c-axis.

In some embodiments, reactive plasma etching of hexagonal single-crystal SiC uses hexagonal single-crystal SiC oriented less than about 0.05° from the (0001) c-axis.

In some embodiments, reactive plasma etching of hexagonal single-crystal SiC uses hexagonal single-crystal SiC oriented less than about 0.1° from the (0001) c-axis.

In some embodiments, reactive plasma etching of hexagonal single-crystal SiC uses hexagonal single-crystal SiC oriented less than about 0.2° from the (0001) c-axis.

In some embodiments, reactive plasma etching of hexagonal single-crystal SiC uses hexagonal single-crystal SiC oriented less than about 0.4° from the (0001) c-axis.

In some embodiments, reactive plasma etching of hexagonal single-crystal SiC uses hexagonal single-crystal SiC oriented less than about 0.8° from the (0001) c-axis.

In some embodiments, reactive plasma etching of hexagonal single-crystal SiC uses hexagonal single-crystal SiC oriented less than about 1.2° from the (0001) c-axis.

In some embodiments, reactive plasma etching of hexagonal single-crystal SiC uses hexagonal single-crystal SiC oriented less than about 2.4° from the (0001) c-axis.

In some embodiments, reactive plasma etching of hexagonal single-crystal SiC uses hexagonal single-crystal SiC with approximately on-axis orientation with respect to the (000-1)(overbar) c-axis.

In some embodiments, reactive plasma etching of hexagonal single-crystal SiC uses hexagonal single-crystal SiC oriented less than about 0.05° from the (000-1)(overbar) c-axis.

In some embodiments, reactive plasma etching of hexagonal single-crystal SiC uses hexagonal single-crystal SiC oriented less than about 0.1° from the (000-1)(overbar) c-axis.

In some embodiments, reactive plasma etching of hexagonal single-crystal SiC uses hexagonal single-crystal SiC oriented less than about 0.2° from the (000-1)(overbar) c-axis.

In some embodiments, reactive plasma etching of hexagonal single-crystal SiC uses hexagonal single-crystal SiC oriented less than about 0.4° from the (000-1)(overbar) c-axis.

In some embodiments, reactive plasma etching of hexagonal single-crystal SiC uses hexagonal single-crystal SiC oriented less than about 0.8° from the (000-1)(overbar) c-axis.

In some embodiments, reactive plasma etching of hexagonal single-crystal SiC uses hexagonal single-crystal SiC oriented less than about 1.2° from the (000-1)(overbar) c-axis.

In some embodiments, reactive plasma etching of hexagonal single-crystal SiC uses hexagonal single-crystal SiC oriented less than about 2.4° from the (000-1)(overbar) c-axis.

The reactive plasma etching is preferably a deep plasma etching. In some aspects of the invention, reactive-ion etching (RIE) is preferred, particularly inductively-coupled plasma (ICP)-RIE. ICP-RIE SiC etching using gases such as $SF_6$ plus argon, oxygen, or other gases beneficially permits the formation of movable, suspended material structures above the recesses.

The deep SiC plasma etch process can also include an alternating plasma etch and sidewall passivation process (similar to the Bosch etch process, as described, for example, in U.S. Pat. Nos. 5,501,893, 6,284,148, and 6,531,068, the contents of which are incorporated herein by reference in their entirety), such as those used for deep reactive-ion etching of silicon. A $CeF_8$ gas is typically used to form the polymer sidewall passivation on the sides of the SiC etched trench. After the protective polymer on the sidewall is formed, a SiC plasma etch is performed using an $SF_6$-based gas plasma etch process for an additional depth. The process of sidewall passivation followed by $SF_6$ based gas plasma etch can be repeated multiple times. The alternating plasma etch and sidewall passivation etch process can provide high aspect ratios, i.e., a ratio of depth to width of 40 or more, preferably 50 or more.

The invention is not to be considered limited to specific plasma chemistry, which may be determined by the specific source gases used and the ratio of these gases. The proportion of silicon carbide reactive species (typically fluorine ions) to adjunct species (such as oxygen or hydrogen ions) may preferably be balanced in order to control the etch rate and depth.

Adjunct ions determine the composition and thickness of the sidewall coating that naturally occurs during reactive ion etching of silicon carbide. The fluorine ions are efficient at removing silicon atoms from the crystal (in the form of volatile silicon tetrafluoride and related compounds), but the reaction of fluorine ions with carbon atoms from the crystal results in both volatile molecules and non-volatile fluorocarbons. The fluorocarbon residue on the sidewalls impedes further etching of these sidewalls and tends to cause narrowing of the width of the etched feature as the depth increases. Oxygen ions in the plasma erodes the sidewall fluorocarbon buildup and can result in more vertical sidewalls for the full depth of the etch process. Hydrogen ions in the plasma affects the chemistry of the sidewall molecules (hydrofluorocarbons) which can make them easier to remove through the action of oxygen reactions or sputtering. Prevention of etch axis wander is achieved by maintaining sidewall trenching for both sides of the etched feature, resulting in a w-shaped bottom of the feature. Once the sidewall trenches merge to a single point, the control over the axis direction is reduced and etch axis wander tends to occur.

Typical gas sources for fluorine in reactive ion etching include sulfur hexafluoride ($SF_6$), trifluoromethane ($CHF_3$), tetrafluoromethane ($CF_4$), octafluorocyclobutane ($C_4F_8$). Sulfur hexafluoride contributes no carbon to the plasma and minimizes the buildup of fluorocarbon coatings. The other fluorine sources can be used to encourage fluorocarbon coating when desired and, in the case of $CHF_3$, can encourage hydrofluorocarbon coating. The source of oxygen is typically molecular oxygen. Inert gases such as argon or helium can also be used to provide pressure or mean-free-path control over the reactive ion dynamics.

Substrate temperature during the plasma etch may also be controlled during deep SiC etching. Temperature control of the silicon carbide crystal impacts sidewall chemistry and vertical etch rate. Temperature control in reactive ion etching is typically achieved by backside cooling with gas, such as helium, maintained at a specified temperature and pressure. Further control over the temperature is achieved by controlling the thermal impedance between the silicon carbide crystal and this backside cooling gas. This can be done by providing a spacer with known thermal conductivity, with thermal grease, or similar means. Finally, a series of short etches separated by thermal equilibration periods allows the heat from the plasma to dissipate and results in more uniform temperature during the active etching.

The electrostatic condition of the silicon carbide also influences reactive ion etching of the crystal. The characteristics of the boundary layer between the high-density plasma and the surface of the wafer depend on whether the wafer is held at electrical ground or allowed to float electrically. This affects the ion density, impact energy, impact angle, and wafer surface temperature, among other factors.

The photolithography-defined electroplated etch mask process first deposits a metal adhesion layer on the SiC. The adhesion layer may include, but is not limited to, a chrome or titanium metal layer with a thickness that is preferably about 10 nm. A chromium adhesion layer was found to be more stable during etching than a titanium adhesion layer and had sufficient bonding to the single crystal silicon carbide material allow the mask to survive the necessary etching conditions.

A metal seed layer is deposited on the metal adhesion layer. The metal seed layer may include, but is not limited to, a nickel metal layer or a gold metal layer with a thickness that is preferably about 100 nm. The metal seed layer should be thick enough to allow uniform distribution of the plating current. An issue for the metal seed layer is that it is desirable that the stress in the metal seed layer be minimized. The deposited gold seed layer typically has less stress than a nickel seed layer.

A photolithography step is performed to define a photoresist material having a selected pattern on the metal seed layer, in order to protect those regions of the metal seed layer where nickel or other photoresist will not be electroplated. A layer of nickel is then electroplated on the metal seed layer to a thickness of about 1 micron or thicker in the regions not protected by the photoresist layer. The photoresist can then be stripped. The electroplated etch-mask is extremely robust during SiC ICP-RIE. Mask selectivity is in excess of 100:1 for the standard $SF_6$ gas SiC etch process.

The seed metal layer and the adhesion metal layer are ion mill etched, and the SiC material is loaded in a plasma etch tool with appropriate grounding and thermal contact for plasma etching. The plasma-etching may be performed using any technique, though deep reactive-ion etching is preferred in some aspects of the invention. Optionally, a Bosch-type process may be used to protect the sidewall during the SiC plasma etch.

After etching, the electroplated photoresist layer, metal seed layer, and metal adhesion layer may be removed, for example, using a chemical etch process.

Figure 2A:
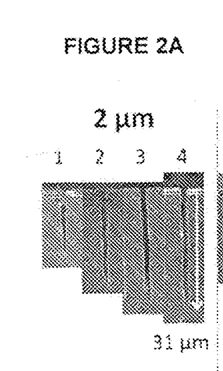
FIGS. 2A-2C show black-and-white photographs illustrating the results of deep plasma etching of hexagonal single-crystal SiC with 4° off-axis orientation with respect to the c-axis.
Figure 2B:
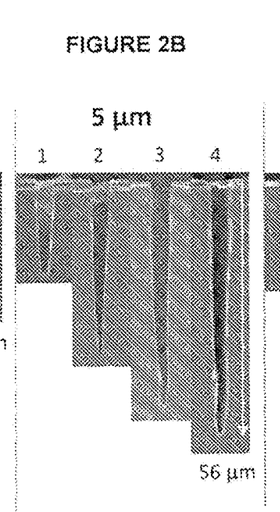
Figure 2C:
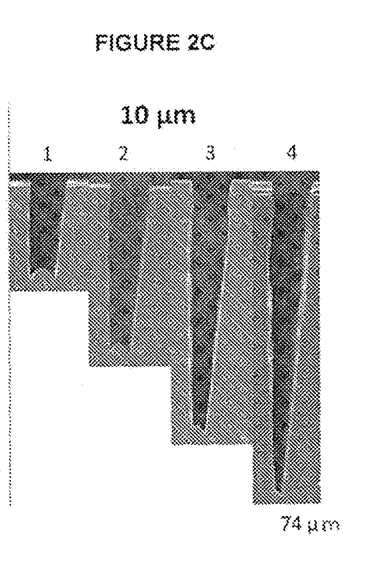

Several issues that are encountered when deep SiC etching off-axis hexagonal single-crystal 4H—SiC are shown in the SEM images provided as FIGS. 2A-2C. The material that was plasma etched in FIGS. 2A-2C is hexagonal single-crystal 4H—SiC with 4° off-axis orientation with respect to the c-axis. The SEM images in FIGS. 2A-2C show a significant degree of poor etch symmetry, especially for the ten micron opening in the nickel etch mask (FIG. 2C). The SEM in FIGS. 2A-2C show etch axis wander, especially for the five micron opening in the nickel etch mask (FIG. 2B). The SEM in FIGS. 2A-2C also show poor sidewall straightness and smoothness, as shown by the jagged spikes into the sidewall, especially for the five micron opening in the nickel etch mask (FIG. 2B).

Figure 3:
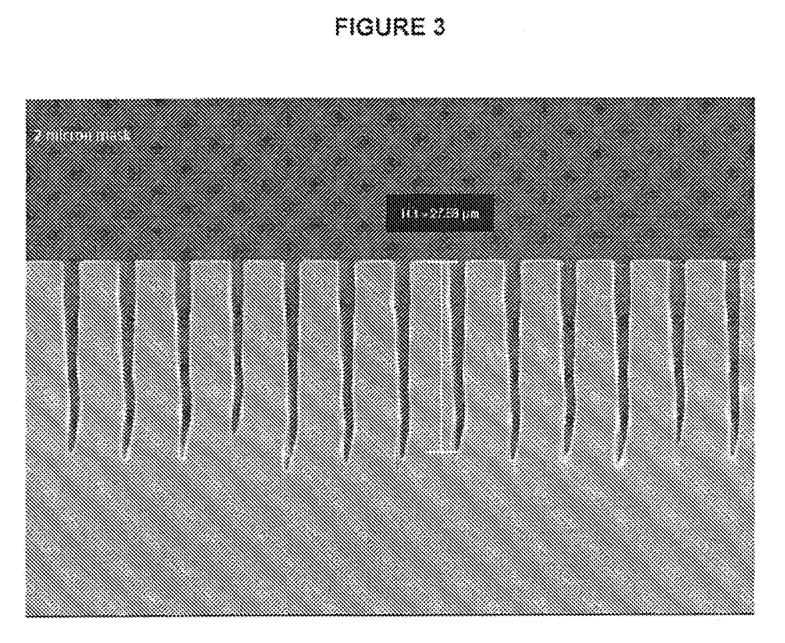
FIG. 3 is a black-and-white photograph illustrating the results of deep plasma etching of hexagonal single-crystal SiC with 4° off-axis orientation with respect to the c-axis.

The material that was plasma etched in FIG. 3 is hexagonal single-crystal 4H—SiC with 4° off-orientation to the c-axis. The SEM in FIG. 3 also shows significant etch axis wander, non-symmetrical etching, and non-straight sidewalls.

Figure 4:
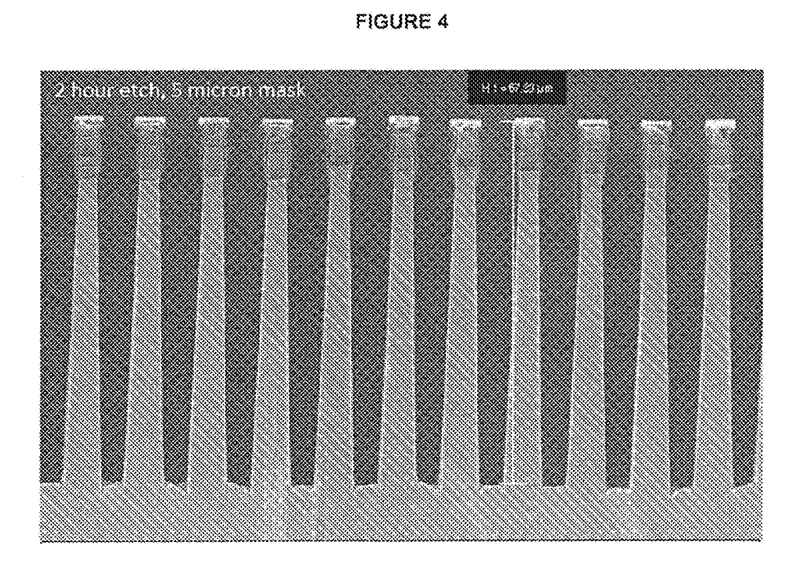
FIG. 4 is a black-and-white photograph illustrating the results of deep plasma etching of hexagonal single-crystal SiC with near 0° on-axis orientation with respect to the c-axis (on-axis orientation to the c-axis).
Figure 5A:
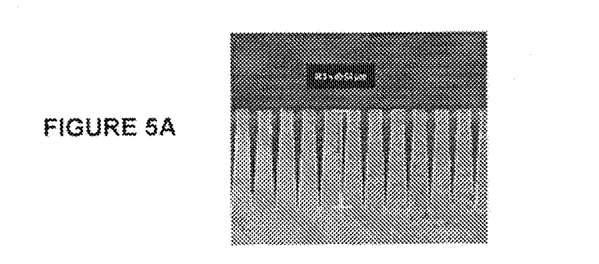
FIGS. 5A-5C shows black-and-white photographs illustrating the results of deep plasma etching of hexagonal single-crystal SiC with near 0° on-axis orientation with respect to the c-axis (on-axis orientation to the c-axis), under different heat sinking and bias conditions.
Figure 5B:
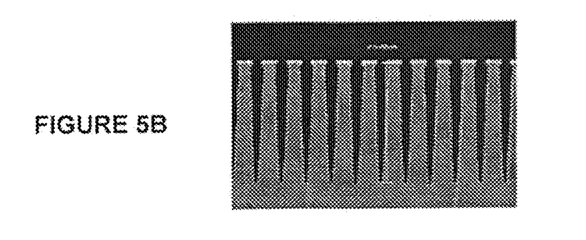
Figure 5C:
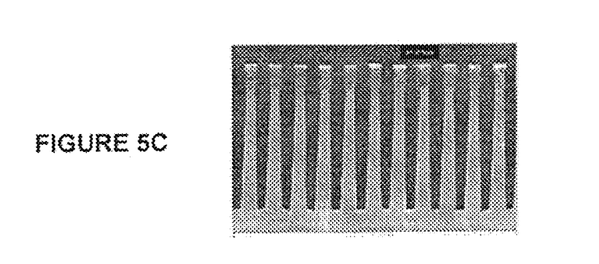

In contrast, the SiC material that was plasma etched in FIGS. 4 and 5A-5C is hexagonal single-crystal 4H—SiC with on-axis orientation with respect to the c-axis. The SEM image in FIG. 4 shows improved etch symmetry, improved sidewall straightness, reduced sidewall wander, and improved sidewall smoothness as compared to the etch in FIGS. 2A-2C and 3 for hexagonal single-crystal SiC with 4° off-axis orientation with respect to the c-axis.

Devices and Systems

The devices and systems that may be formed using the methods of the invention encompass microelectromechanical systems (MEMS) and nanoelectromechanical systems (NEMS). For example, microelectromechanical beams, microelectromechanical membranes, microelectromechanical cantilevers, microelectromechanical bridges, and microelectromechanical field effect transistor devices may be formed to a high level of accuracy and detail using the methods of the invention. Also included within the materials that may be formed using the methods of the invention are gyroscopes, accelerometers, and timing oscillators. The materials may be used as inertial sensors (particularly in non-GPS environments), and high-G timing oscillators for projectiles.

In some MEMS devices, actuation or sensing can be achieved through electrostatic coupling. The electrostatic coupling between the suspended material structure and the anchor material structure is dependent on the width of the trench etched region and the sidewall angle of the trench region. The sidewall angle of the deep trench can be in the range of about 3 degrees to about 15 degrees off of the vertical axis. The aspect ratio of the deep trench can be in the range of greater than 5 to 1, to greater than 100 to 1. The width of the trench can be as small as about 0.5 microns or as large as about 5 to 8 microns. The width of the deep trench can be about 1 micron for a suspended material structure that is less than about 10 microns thick. The width of the deep trench can be about 2 microns for a suspended material structure that is less than about 20 microns thick. The width of the deep trench can be about 3 microns for a suspended material structure that is less than about 40 microns thick. The width of the deep trench can be about 4 microns for a suspended material structure that is less than about 60 microns thick.

EXAMPLES

The invention will now be particularly described by way of example. However, it will be apparent to one skilled in the art that the specific details are not required in order to practice the invention. The following descriptions of specific embodiments of the present invention are presented for purposes of illustration and description. They are not intended to be exhaustive of or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated.

Example 1

Figure 6A:
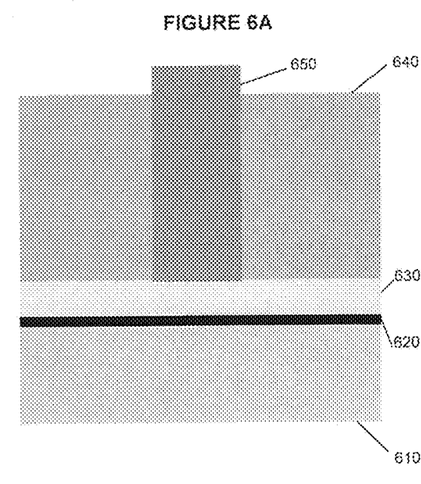
FIGS. 6A-6B are side view illustrations of a method for utilizing an etch mask.
Figure 6B:
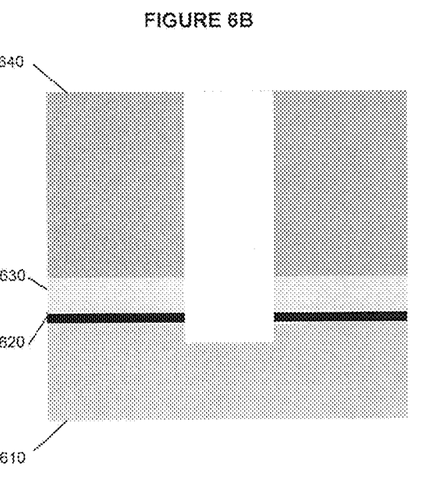

Etching of an n-type 4H—SiC material provided on a substrate was carried out as shown in FIGS. 6A-6B.

A chrome metal adhesion layer 620 about 10 nm thick was deposited on the SiC material 610.

A seed metal layer 630 about 100 nm thick was deposited on the chrome metal adhesion layer 620.

A patterned photoresist layer 640 was formed to protect those regions where nickel will not be electroplated.

A nickel layer 650 was electroplated to a thickness of about 1 micron or thicker.

The photoresist 640 was stripped.

The seed metal layer 630 and the adhesion metal layer 620 were ion mill etched.

The SiC material 610 was loaded in a plasma etch tool with appropriate grounding and thermal contact.

The SiC material 610 was plasma etched. Optionally, a Bosch-type process may be used to protect the sidewall during the SiC plasma etch.

After etching, the electroplated nickel layer 650, metal seed layer 630, and metal adhesion layer 620 were removed. A chemical etch process can be used to remove the electroplated nickel layer 650, metal seed layer 630, and metal adhesion layer 620.

Example 2

Figure 7:
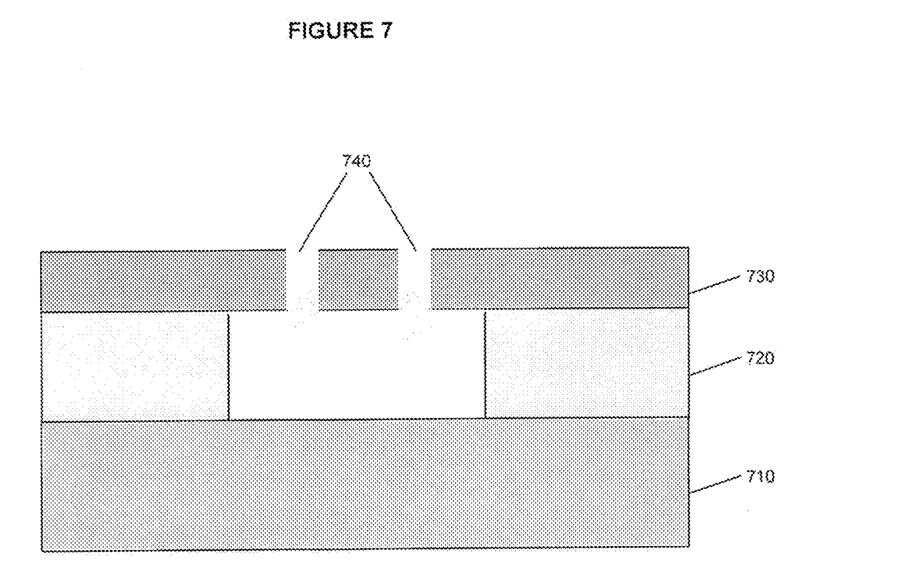
FIG. 7 is a side view illustration of a method for conducting a deep silicon carbide etch.

A gyroscope was fabricated by bonding two SiC substrates 710 and 730 together using a 5 micron thick $SiO_2$ layer 720 between the two, as shown in FIG. 7. One of the SiC substrates 730 was thinned to 40 microns. A gyroscope pattern 740 was etched into the 40 micron thick on-axis hexagonal SiC 730 using the deep SiC etch technique.

Figure 8:
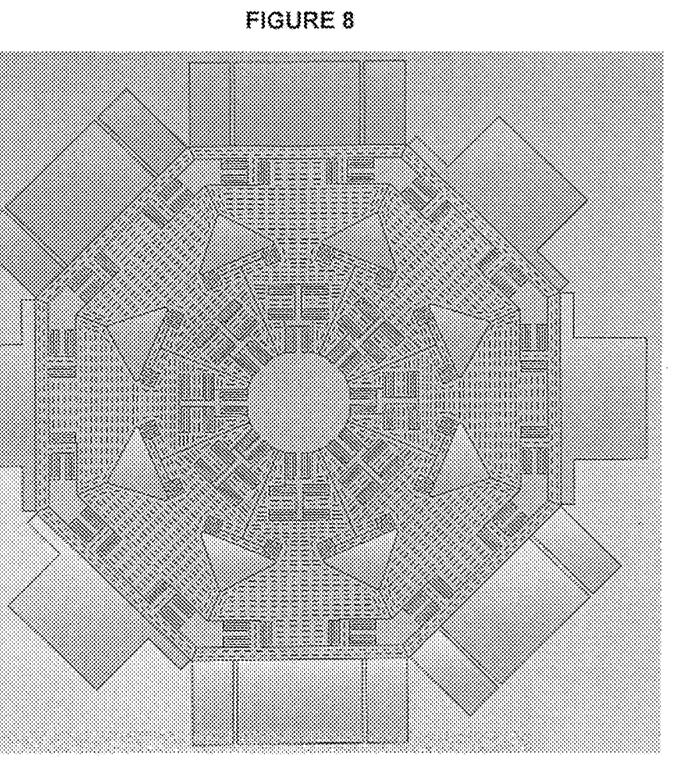
FIG. 8 is a schematic for a gyroscope made in accordance with the methods of the invention.

An SEM image of the etched gyroscope is shown in FIG. 8.

It will, of course, be appreciated that the above description has been given by way of example only and that modifications in detail may be made within the scope of the present invention.

Throughout this application, various patents and publications have been cited. The disclosures of these patents and publications in their entireties are hereby incorporated by reference into this application, in order to more fully describe the state of the art to which this invention pertains.

The invention is capable of modification, alteration, and equivalents in form and function, as will occur to those ordinarily skilled in the pertinent arts having the benefit of this disclosure. While the present invention has been described with respect to what are presently considered the preferred embodiments, the invention is not so limited. To the contrary, the invention is intended to cover various modifications and equivalent arrangements included within the spirit and scope of the description provided above.

What is claimed:

1. A method for deep reactive-ion etching silicon carbide, comprising:
   providing a hexagonal, single-crystal silicon carbide (SiC) material that is oriented approximately on-axis with respect to a c-axis of the SiC crystal;
   applying an etch mask to the SiC material; and
   conducting deep reactive-ion etching (RIE) of the SiC material in a direction that is no more than 2.4° from a direction of the c-axis of the SiC material to produce etch features
   having a width of less than 8 μm and having an aspect ratio (trench depth:trench width) greater than 25.

2. The method of claim 1, wherein the deep RIE is conducted using a gas selected from the group consisting of sulfur hexafluoride (SF6), trifluoromethane (CHF3), tetrafluoromethane (CF4), and octafluorocyclobutane (C4F8).

3. The method of claim 1, wherein the deep RIE comprises sidewall passivation.

4. The method of claim 1, wherein the hexagonal, single-crystal SiC is selected from the group consisting of 2H—SiC, 4H—SiC, and 6H—SiC.

5. The method of claim 1, wherein the hexagonal, single-crystal SiC is n-type SiC.

6. The method of claim 1, wherein the hexagonal, single-crystal SiC material is semi-insulating SiC material.

7. The method of claim 1, wherein the approximately on-axis orientation of the SiC material results in improved etch symmetry, improved sidewall straightness, reduced sidewall wander, and improved sidewall smoothness as compared to a hexagonal, single-crystal SiC material oriented 3 or more degrees off axis with respect to a c-axis of the SiC crystal.

8. The method of claim 1, wherein the SiC material is oriented less than about 1.2 degrees from the c-axis.

9. The method of claim 1, wherein the SiC material is oriented less than about 0.8 degrees from the c-axis.

10. The method of claim 1, wherein the SiC material is oriented less than about 0.4 degrees from the c-axis.

11. The method of claim 1, wherein the SiC material is oriented less than about 0.2 degrees from the c-axis.

12. The method of claim 1, wherein the SiC material is oriented less than about 0.1 degrees from the c-axis.

13. The method of claim 1, wherein the SiC material is oriented less than about 0.05 degrees from the c-axis.

14. An etched, hexagonal, single-crystal silicon carbide (SiC) material oriented approximately on-axis with respect to a c-axis of the SiC crystal material, comprising etch features extending in a direction that is within 2.4° of a direction of the c-axis of the SiC crystal material, having a width of less than 8 μm, and having an aspect ratio (trench depth:trench width) greater than 25.

15. The etched SiC material of claim 14, wherein the material forms a structure selected from the group consisting of microelectromechanical beams, microelectromechanical membranes, microelectromechanical cantilevers, microelectromechanical bridges, microelectromechanical field effect transistors, gyroscopes, accelerometers, timing oscillators, and inertial sensors.

16. The etched SiC material of claim 14, wherein the material exhibits improved etch symmetry, improved sidewall straightness, reduced sidewall wander, and improved sidewall smoothness as compared to an etched, hexagonal, single-crystal SiC material oriented off-axis with respect to a c-axis of the SiC crystal.

17. An etched, hexagonal, single-crystal silicon carbide (SiC) material formed by a method comprising:
   providing a hexagonal, single-crystal, silicon carbide (SiC) material that is oriented approximately on-axis with respect to a c-axis of the SiC crystal;
   applying an etch mask to the SiC material; and
   conducting deep reactive-ion etching (RIE) of the SiC material in a direction that is no more than 2.4° from a direction of the c-axis of the SiC material to produce etched features
   having a width of less than 8 μm and having an aspect ratio (trench depth:trench width) greater than 25 in the SiC material.

* * * * *